United States Patent
He et al.

(10) Patent No.: US 10,825,870 B2
(45) Date of Patent: Nov. 3, 2020

(54) PIXEL STRUCTURE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Panting He, Beijing (CN); Fengli Ji, Beijing (CN); Ju Mei, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/539,369

(22) Filed: Aug. 13, 2019

(65) Prior Publication Data

US 2020/0075687 A1   Mar. 5, 2020

(30) Foreign Application Priority Data

Aug. 30, 2018   (CN) .......................... 2018 1 1004317

(51) Int. Cl.
*H01L 27/32*   (2006.01)
(52) U.S. Cl.
CPC ...... *H01L 27/3213* (2013.01); *H01L 27/3216* (2013.01)
(58) Field of Classification Search
CPC ............. H01L 27/3213; H01L 27/3216; H01L 27/3218; H01L 51/001; H01L 51/0011
See application file for complete search history.

(56) References Cited

U.S. PATENT DOCUMENTS

| 2002/0014837 A1* | 2/2002 | Kim ..................... H01L 27/329 313/505 |
| 2004/0036421 A1* | 2/2004 | Arnold ................. G09G 3/3216 315/169.3 |
| 2008/0084376 A1* | 4/2008 | Hirota ................. H01L 27/3213 345/88 |

(Continued)

FOREIGN PATENT DOCUMENTS

| CN | 205231067 U | 5/2016 |
| CN | 106597802 A | 4/2017 |
| CN | 106653799 A | 5/2017 |

OTHER PUBLICATIONS

Office Action issued in corresponding 201811004317.7 dated Mar. 11, 2020.

*Primary Examiner* — Donald L Raleigh
(74) *Attorney, Agent, or Firm* — Arent Fox LLP; Michael Fainberg

(57) ABSTRACT

A pixel structure and a display device are provided. The pixel structure includes: a plurality of elements in an array, wherein each of the elements includes at least one pixel unit, and each of the pixel unit includes four sub-pixels in array, the four sub-pixels including one first sub-pixel in a first color, one second sub-pixel in a second color, and two third sub-pixels in a third color, wherein the first sub-pixel and the second sub-pixel are at diagonal positions in the pixel unit, and the two third sub-pixels are at the other diagonal positions in the pixel unit; and a plurality of the sub-pixels in two adjacent pixel units include at least one sub-pixel group, the sub-pixel group including two adjacent sub-pixels in the same color.

9 Claims, 10 Drawing Sheets

(56) References Cited

U.S. PATENT DOCUMENTS

2009/0302331 A1* 12/2009 Smith ................ H01L 27/3216
257/88
2016/0027376 A1* 1/2016 Chen .................... G09G 3/3208
345/694
2016/0284769 A1 9/2016 Chien et al.

* cited by examiner

PIXEL STRUCTURE AND DISPLAY DEVICE

CROSS-REFERENCES TO RELATED APPLICATION

This application claims priority to Chinese patent application No. 201811004317.7 filed on Aug. 30, 2018, which is incorporated herein by reference in its entirety.

FIELD

The present disclosure relates to the field of display technologies, and particularly to a pixel structure and a display device.

BACKGROUND

An Organic Light-Emitting Diode (OLED) display panel has become the most promising new flat display panel due to its active self-emission, wide angle of view, wide color gamut, high response speed, high contrast, and other display characteristics, and its low weight, small thickness, flexibility, energy saving, and other advantages.

SUMMARY

In one aspect, an embodiment of the disclosure provides a pixel structure. The pixel structure includes: a plurality of elements in an array, wherein each of the elements includes at least one pixel unit, and each of the at least one pixel unit includes four sub-pixels in array, the four sub-pixels include one first sub-pixel in a first color, one second sub-pixel in a second color, and two third sub-pixels in a third color, wherein the first sub-pixel and the second sub-pixel are at diagonal positions of the pixel unit, and the two third sub-pixels are at the other diagonal positions of the pixel unit; and a plurality of the sub-pixels in two adjacent pixel units include at least one sub-pixel group, the sub-pixel group including two adjacent sub-pixels in a same color.

In some embodiments, each of the elements includes four pixel units in array, the sub-pixels in two of the four pixel units in a row direction being mirror symmetry.

In some embodiments, the four pixel units of each of the elements include a first pixel unit and a second pixel unit in one row, and a third pixel unit and a fourth pixel unit in another row, the first pixel unit and the third pixel unit being in one column, the second pixel unit and the fourth pixel unit being in another column, the sub-pixels in the first pixel unit being mirror symmetric to the sub-pixels in the second pixel unit, the sub-pixels in the third pixel unit being mirror symmetric to the sub-pixels in the fourth pixel unit; wherein in the first pixel unit, one third sub-pixel is at top-right corner of the first pixel unit, the other third sub-pixel is at bottom-left corner of the first pixel unit, the second sub-pixel is at top-left corner of the first pixel unit, and the first sub-pixel is at bottom-right corner of the first pixel unit; in the third pixel unit, one third sub-pixel is at top-left corner of the third pixel unit, the other third sub-pixel is at bottom-right corner of the third pixel unit, the second sub-pixel is at top-right corner of the third pixel unit, and the first sub-pixel is at bottom-left corner of the third pixel unit; and wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In some embodiments, each of the elements includes four pixel units in array, the sub-pixels in two of the four pixel units in a column direction being mirror symmetry.

In some embodiments, the four pixel units of each of the elements include a first pixel unit and a second pixel unit in one row, and a third pixel unit and a fourth pixel unit in another row, the first pixel unit and the third pixel unit being in one column, the second pixel unit and the fourth pixel unit being in another column, the sub-pixels in the first pixel unit being mirror symmetric to the sub-pixels in the third pixel unit, the sub-pixels in the second pixel unit being mirror symmetric to the sub-pixels in the fourth pixel unit; wherein in the first pixel unit, one third sub-pixel is at top-right corner of the first pixel unit, the other third sub-pixel is at bottom-left corner of the first pixel unit, the first sub-pixel is at top-left corner of the first pixel unit, and the second sub-pixel is at bottom-right corner of the first pixel unit; in the second pixel unit, one third sub-pixel is at top-left corner of the second pixel unit, the other third sub-pixel is at bottom-right corner of the second pixel unit, the second sub-pixel is at top-right corner of the second pixel unit, and the first sub-pixel is at bottom-left corner of the second pixel unit; and wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In some embodiments, each of the elements includes four pixel units in array, the sub-pixels in two of the four pixel units in a row direction being mirror symmetry, and the sub-pixels in two of the four pixel units in a column direction being mirror symmetry.

In some embodiments, the four pixel units of each of the elements include a first pixel unit and a second pixel unit in one row, and a third pixel unit and a fourth pixel unit in another row, the first pixel unit and the third pixel unit being in one column, the second pixel unit and the fourth pixel unit being in another column, the sub-pixels in the first pixel unit being mirror symmetric to the sub-pixels in the second pixel unit, the sub-pixels in the first pixel unit being mirror symmetric to the sub-pixels in the third pixel unit, and the sub-pixels in the second pixel unit being mirror symmetric to the sub-pixels in the fourth pixel unit; wherein in the first pixel unit, one third sub-pixel is at top-right corner of the first pixel unit, the other third sub-pixel is at bottom-left corner of the first pixel unit, the first sub-pixel is at top-left corner of the first pixel unit, and the second sub-pixel is at bottom-right corner of the first pixel unit; wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In some embodiments, each of the elements includes two pixel units, the sub-pixels in the two pixels units in a row direction being mirror symmetry.

In some embodiments, the two pixel units of each of the elements includes a first pixel unit and a second pixel unit in a same row, the sub-pixels in the first pixel unit being mirror symmetric to the sub-pixels in the second pixel unit in a row direction; wherein in the first pixel unit, one third sub-pixel is at top-right corner of the first pixel unit, the other third sub-pixel is at bottom-left corner of the first pixel unit, the first sub-pixel is at top-left corner of the first pixel unit, and the second sub-pixel is at bottom-right corner of the first pixel unit; wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In some embodiments, each of the elements includes two pixel units, the sub-pixels in the two pixels units in a column direction being mirror symmetry.

In some embodiments, the two pixel units of each of the elements include a first pixel unit and a second pixel unit in a same column, the sub-pixels in the first pixel unit being mirror symmetric to the sub-pixels in the second pixel unit in a column direction; wherein in the first pixel unit, one third sub-pixel is at top-left corner of the first pixel unit, the other third sub-pixel is at bottom-right corner of the first pixel unit, the first sub-pixel is at top-right corner of the first pixel unit, and the second sub-pixel is at bottom-left corner of the first pixel unit; wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In some embodiments, each of the elements includes one pixel unit, and two pixel units adjacent in a column direction are staggered.

In some embodiments, in each of the pixel units, one third sub-pixel is at top-right corner of the pixel unit, the other third sub-pixel is at bottom-left corner of the pixel unit, the first sub-pixel is at top-left corner of the pixel unit, and the second sub-pixel is at bottom-right corner of the pixel unit.

In some embodiments, in each of the pixel units, a pixel area of the first sub-pixel is same as a pixel area of the second sub-pixel, the pixel area of the first sub-pixel is twice a pixel area of the third sub-pixel.

In some embodiments, in each of the pixels units, a shape of the third sub-pixel is a square, a shape of the first sub-pixel and a shape of the second sub-pixel are a rectangle formed by two third sub-pixels; and a length direction of the first sub-pixel and a length direction of the second sub-pixel in each of the pixels units is a column direction of the pixel units.

In some embodiments, the two pixel units adjacent in the column direction are staggered in the column direction by a half of a width of one of the pixel units, the width of the pixel unit is the width of the pixel unit in the row direction.

In some embodiments, in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

In another aspect, an embodiment of the disclosure further provides a display device including: an array substrate and the pixel structure according to any one of the embodiments above on the array substrate.

DETAILED DESCRIPTION

The technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

Figures 1, 2:
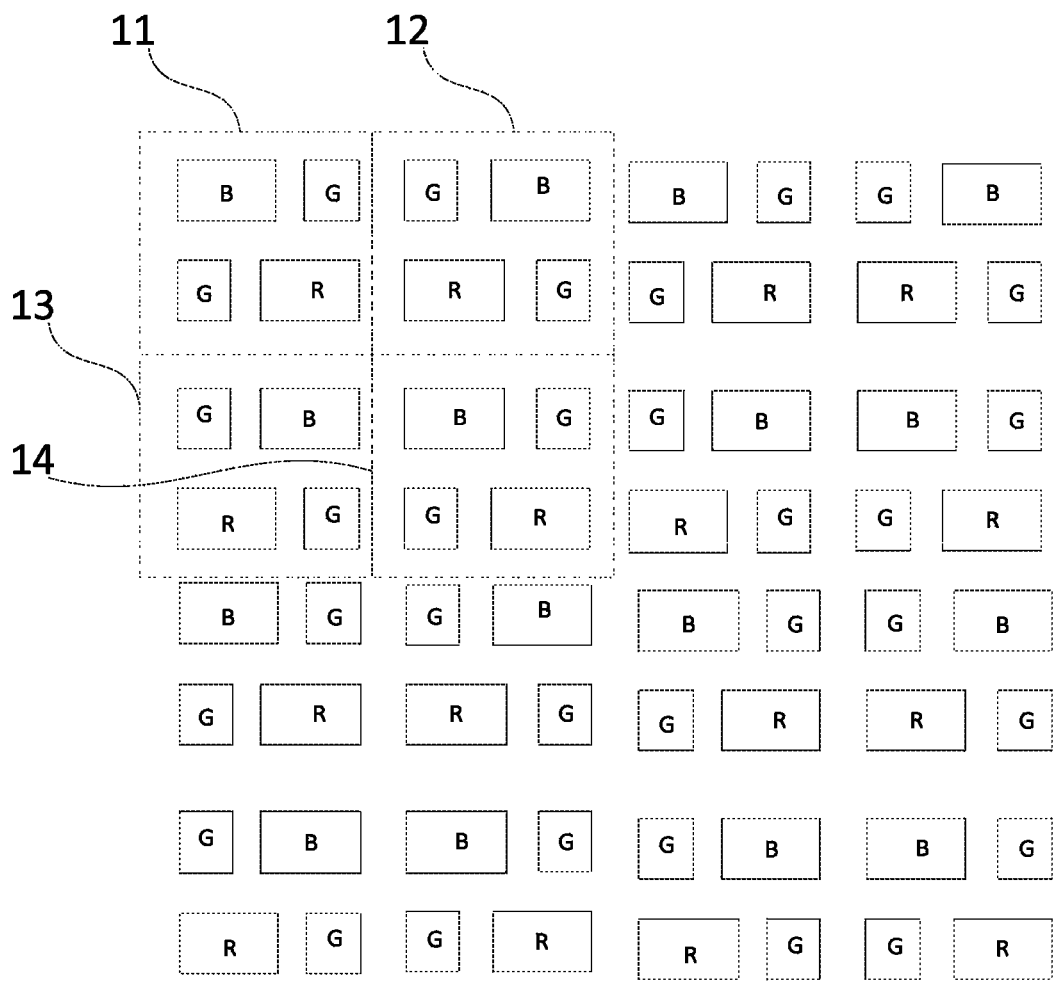
FIG. 1 is a schematic structural diagram of the pixel structure in the related art.
FIG. 2 is a first schematic structural diagram of a pixel structure according to an embodiment of the disclosure.

In an arrangement structure of organic light-emitting diode pixels in the related art as illustrated in FIG. 1, typically three rows of sub-pixel units is a repeating element, and each repeating element includes red (R) sub-pixels, green (G) sub-pixels, and blue (B) sub-pixels, where in the first row of sub-pixels, two R sub-pixels, and two G sub-pixels are arranged alternately, the sub-pixels of the second row is arranged as same as sub-pixels of the first row, and the third row of sub-pixels include B sub-pixels. In each arrangement of sub-pixels, four R sub-pixels share a mask opening (as denoted in a dotted box B), and four G sub-pixels share a mask opening (as denoted in a dotted box A).

A light-emitting layer in an OLED element is generally formed in a vapor plating process in which a Fine Metal Mask (FMM) is used for shielding, so that a light-emitting material is vapor-plated onto a specified position on a glass backboard according to an opening shape of the mask, and generally an opening on the mask corresponds to a sub-pixel in an OLED element pixel structure. However there may be larger mask openings common respectively to the R sub-pixels and the G sub-pixels in the pixel arrangement structure above, but the B sub-pixels lie on a straight line, so there is a smaller metal mask rib (opening boundary distance) corresponding thereto; and since the sub-pixels in the different colors are arranged non-uniformly, there is a poor light-emission effect.

The embodiments of the disclosure provide a pixel structure and a display panel, which can improve a poor light-emission effect and improve a good yield ratio.

The embodiments of the disclosure provide a pixel structure, as illustrated in FIG. 2, FIG. 6, FIG. 10, FIG. 14, and FIG. 18, the pixel structure includes: a plurality of elements arranged in an array. Each repeating element includes at least one pixel unit, and each pixel unit includes four sub-pixels in array, the four sub-pixels includes one first sub-pixel in a first color, one second sub-pixel in a second color, and two third sub-pixels in a third color, where the first sub-pixel and the second sub-pixel are located at diagonal positions in the pixel unit, and the two third sub-pixels are located on the other diagonal positions in the pixel unit. A plurality of the sub-pixels in two adjacent pixel units include at least one sub-pixel group, and the sub-pixel group includes two adjacent sub-pixels in a same color.

In the pixel structure above, each pixel unit includes four sub-pixels including one first sub-pixel in a first color, one second sub-pixel in a second color, and two third sub-pixels in a third color, where the first sub-pixel and the second sub-pixel are located at diagonal positions in the pixel unit, and the two third sub-pixels are located at the other diagonal positions in the pixel unit, so that sub-pixels in each pixel unit are arranged uniformly; and each repeating element includes at least one pixel unit, and the elements are arranged in an array, so that the pixel structure as a whole has a good light-emission effect, thus improving a good yield ratio. Since the sub-pixel group includes two adjacent sub-pixels in the same color, and the plurality of sub-pixels in two adjacent pixel units include at least one sub-pixel group, so that two ones of the plurality of sub-pixels in the two adjacent sub-pixels share a larger metal mask opening, thus lowering the difficulty of alignment, increasing the size of a mask rib, improving the strength of a mask, and reducing the thickness of the mask, so a shadow can be narrowed, a color crosstalk can be alleviated, and a good yield ratio can be improved.

In the pixel structure above, in order to further improve the good yield ratio, each repeating element can include four pixel units, two pixel units, or one pixel unit. For the sake of a convenient description, the first sub-pixel is a red (R) sub-pixel configured to emit red light, the second sub-pixel is a blue (B) sub-pixel configured to emit blue light, and the third sub-pixels are green (G) sub-pixels configured to emit green light, where the colors of the first sub-pixel, the second sub-pixel, and the third sub-pixels can vary without affecting the pixel structure.

In some embodiments, each repeating element includes four pixel units arranged in array, where the sub-pixels in two pixel units in the row direction are mirror symmetry, and/or the sub-pixels in two pixel units in the column direction are mirror symmetry.

The sub-pixels in two pixel units being mirror symmetry refers to that the sub-pixels in the two pixels units are axial symmetry along a center axis between the two adjacent pixel units.

In the pixel structure above, each repeating element includes four pixel units arranged in array, and the four pixel units can be arranged in the following three patterns.

In a first pattern, the sub-pixels in two pixel units in the row direction among the four pixel units in array are arranged in mirror symmetry.

As illustrated in FIG. 2, a repeating element includes four pixel units in array, which are a first pixel unit 11, a second pixel unit 12, a third pixel unit 13, and a fourth pixel unit 14 including 16 sub-pixels in total. The first pixel unit 11 and the second pixel unit 12 are in a first row of the repeating element, the third pixel unit 13 and the fourth pixel unit 14 are in a second row of the repeating element, the first pixel unit 11 and the third pixel unit 13 are in a first column of the repeating element, the second pixel unit 12 and the fourth pixel unit are in a second column of the repeating element.

Each pixel unit includes one R sub-pixel, one B sub-pixel, and two G sub-pixels, the first pixel unit 11 includes the B sub-pixel located at the top-left corner of the first pixel unit, the R sub-pixel located at the bottom-right corner of the first pixel unit, and the G sub-pixels located at the bottom-left corner and the top-right corner of the first pixel unit, the sub-pixels in the second pixel unit 12 are mirror symmetric to the sub-pixels in the first pixel unit 11, the third pixel unit 13 includes the R sub-pixel located at the bottom-left corner of the third pixel unit, the B sub-pixel located at the top-right corner of the third pixel unit, and the G sub-pixels located at the top-left corner and the bottom-right corner of the third pixel unit, and the sub-pixels in the fourth pixel unit 14 are mirror symmetric to the sub-pixels in the third pixel unit 13.

In the disclosure, the four sub-pixels of each pixel unit are arranged in array, thus the sub-pixel being at top-left corner of the pixel unit refers to the sub-pixel being in a first row and a first column of the square array, the sub-pixel being at top-right corner of the pixel unit refers to the sub-pixel being in a first row and a second column of the square array, the sub-pixel being at bottom-left corner of the pixel unit refers to the sub-pixel being in a second row and a first column of the square array, the sub-pixel being at bottom-right corner of the pixel unit refers to the sub-pixel being in a second row and a second column of the square array.

In the disclosure, the sub-pixels in two pixel units being mirror symmetry refers to that the sub-pixels in the two pixels units are axial symmetry along a center axis between the two adjacent pixel units. For example, as illustrated in FIG. 2, the sub-pixels in the first pixel unit 11 being mirror symmetric to the sub-pixels in the second pixel unit 12 in the row direction refers to that: the sub-pixels in the first pixel unit 11 are axis symmetric to the sub-pixels in the second pixel unit 12 in the row direction along the center axis between the first pixel unit 11 and the second pixel unit 12.

Specifically, at least the colors of the sub-pixels, the pixel areas of the sub-pixels, and the shapes of the sub-pixels are mirror symmetry.

In the above arrangement, the R sub-pixel and the B sub-pixel in each pixel unit are adjacent respectively to, and can share the same metal mask openings as, R and B sub-pixels in another pixel unit to the left or right of the pixel unit, so G sub-pixels in four adjacent pixel units can share the same metal mask opening.

Figure 3:
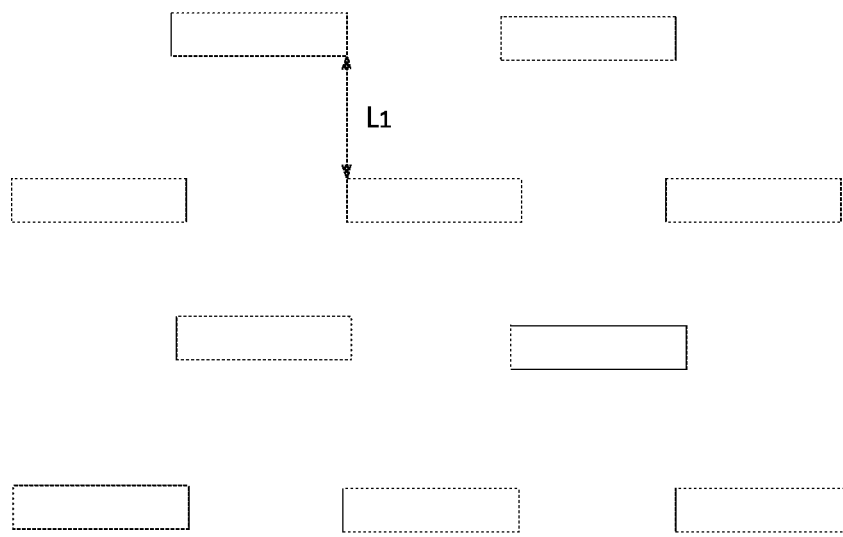
FIG. 3 is a schematic structural diagram of a mask corresponding to R sub-pixels in FIG. 2.
Figure 4:
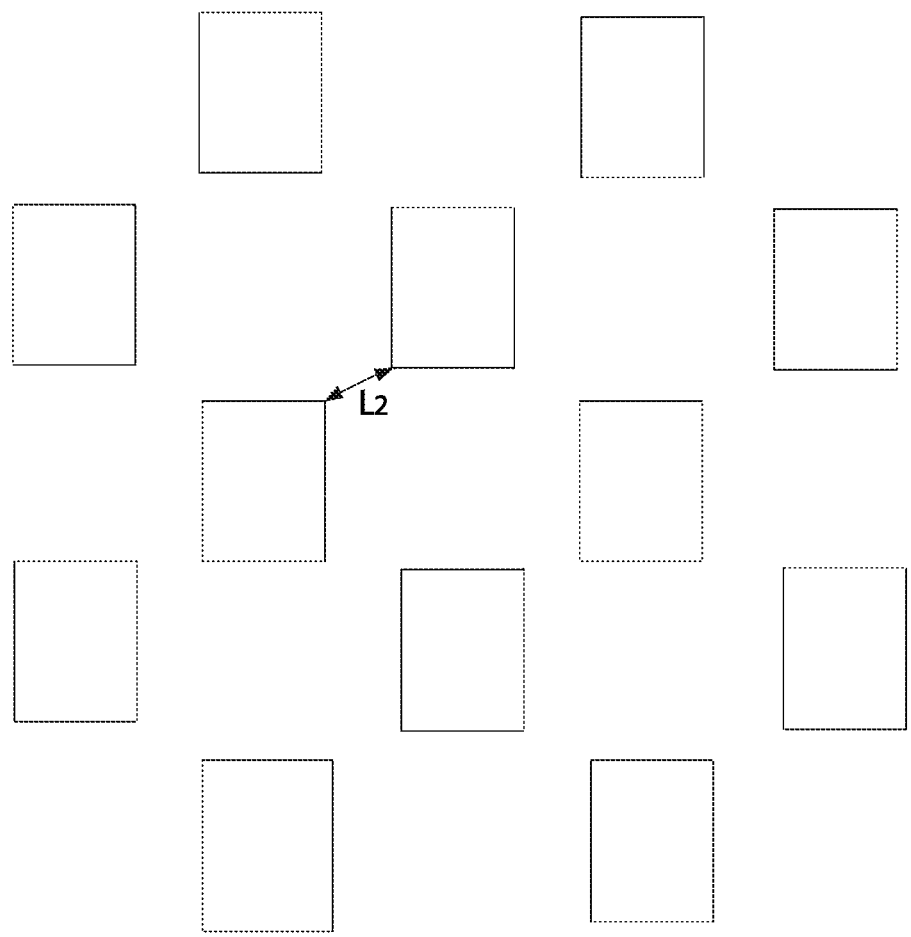
FIG. 4 is a schematic structural diagram of a mask corresponding to G sub-pixels in FIG. 2.
Figure 5:
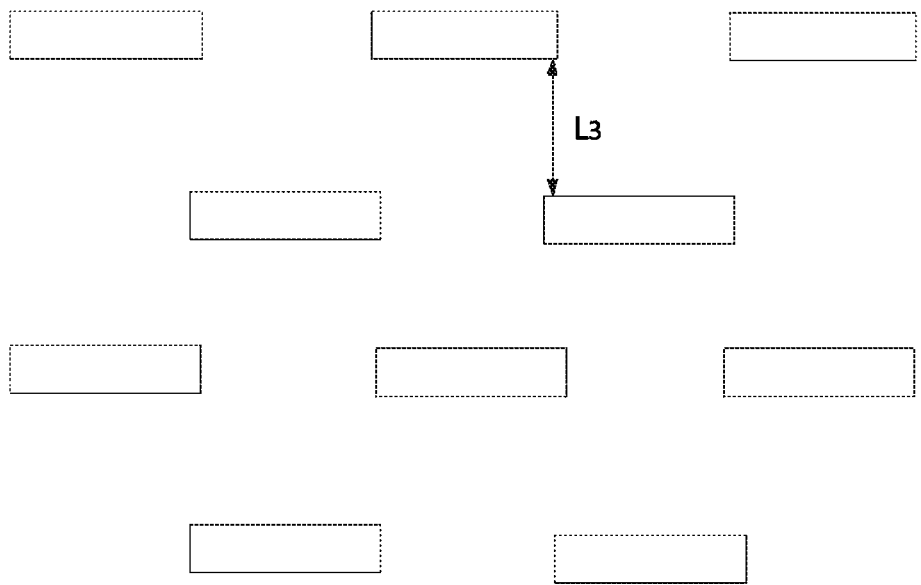
FIG. 5 is a schematic structural diagram of a mask corresponding to B sub-pixels in FIG. 2.

FIG. 3, FIG. 4, and FIG. 5 illustrate the metal mask openings corresponding to the R, and B sub-pixels in the pixel structure of FIG. 2 respectively, and as compared with the corresponding mask opening in FIG. 1, the size of the mask opening corresponding to the R sub-pixels is increased, the difficulty of alignment is lowered, the size $L_1$ of a mask rib corresponding to the R sub-pixels is increased, the strength of a mask corresponding to the R sub-pixels is improved, and the thickness of the mask corresponding to the R sub-pixels can be reduced in effect, as illustrated in FIG. 3, so a shadow can be narrowed, a color crosstalk can be alleviated, and a good yield ratio can be improved; as compared with the corresponding mask opening in FIG. 1, the size of the mask opening corresponding to the G sub-pixels is increased, the difficulty of alignment is lowered, the size $L_2$ of a mask rib corresponding to the G sub-pixels is increased, the strength of a mask corresponding to the G sub-pixels is improved, and the thickness of the mask corresponding to the G sub-pixels can be reduced in effect, as illustrated in FIG. 4, so a shadow can be narrowed, a color crosstalk can be alleviated, and a good yield ratio can be improved; and as compared with the corresponding mask opening in FIG. 1, the size of the mask opening corresponding to the B sub-pixels is increased, the difficulty of alignment is lowered, the size $L_3$ of a mask rib corresponding to the B sub-pixels is increased, the strength of a mask corresponding to the B sub-pixels is improved, and the thickness of the mask corresponding to the B sub-pixels can be reduced in effect, as illustrated in FIG. 4, so a shadow can be narrowed, a color crosstalk can be alleviated, and a good yield ratio can be improved.

In a second pattern, the sub-pixels in two pixel units in the column direction among the four pixel units in array are arranged in mirror symmetry.

Figure 6:
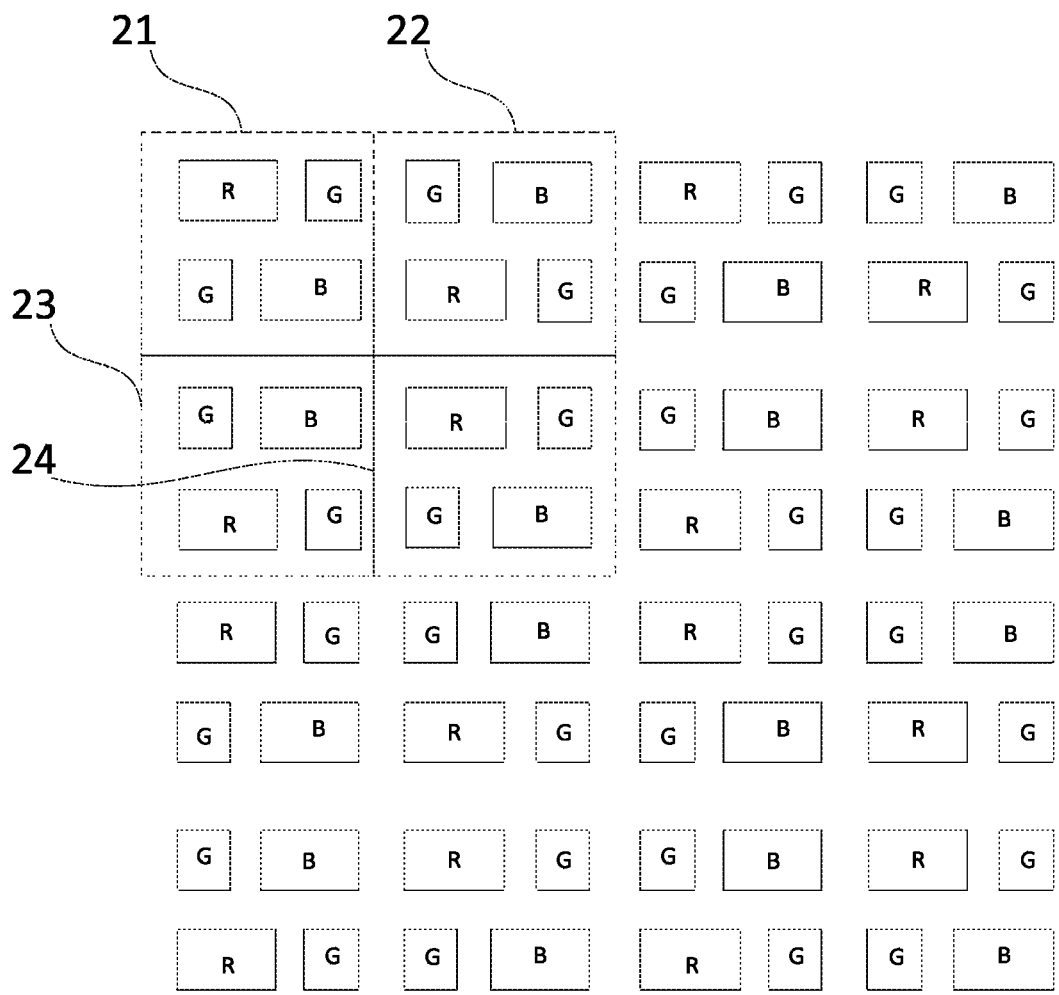
FIG. 6 is a second schematic structural diagram of the pixel structure according to the embodiment of the disclosure.

As illustrated in FIG. 6, a repeating element includes four pixel units in array, which are a first pixel unit 21, a second pixel unit 22, a third pixel unit 23, and a fourth pixel unit 24 including 16 sub-pixels in total. The first pixel unit 21 and the second pixel unit 22 are in a first row of the repeating element, the third pixel unit 23 and the fourth pixel unit 24 are in a second row of the repeating element, the first pixel unit 21 and the third pixel unit 23 are in a first column of the repeating element, the second pixel unit 22 and the fourth pixel unit 24 are in a second column of the repeating element.

Each pixel unit includes one R sub-pixel, one B sub-pixel, and two G sub-pixels, the first pixel unit 21 includes the R sub-pixel located at the top-left corner of the first pixel unit, the B sub-pixel located at the bottom-right corner of the first pixel unit, and the G sub-pixels located at the bottom-left corner and the top-right corner of the first pixel unit, the sub-pixels in the third pixel unit 23 are mirror symmetric to the sub-pixels in the first pixel unit 21, the second pixel unit 22 includes the R sub-pixel located at the bottom-left corner of the second pixel unit, the B sub-pixel located at the top-right corner of the second pixel unit, and the G sub-pixels located at the top-left corner and the bottom-right corner of the second pixel unit, and sub-pixels in the fourth pixel unit 24 and the second pixel unit 22 are mirror symmetry.

The R sub-pixel and the B sub-pixel in each pixel unit are adjacent respectively to, and can share the same metal mask openings as, R and B sub-pixels in another pixel unit below or above the pixel unit, so G sub-pixels in four adjacent pixels can share the same metal mask opening.

Figure 7:
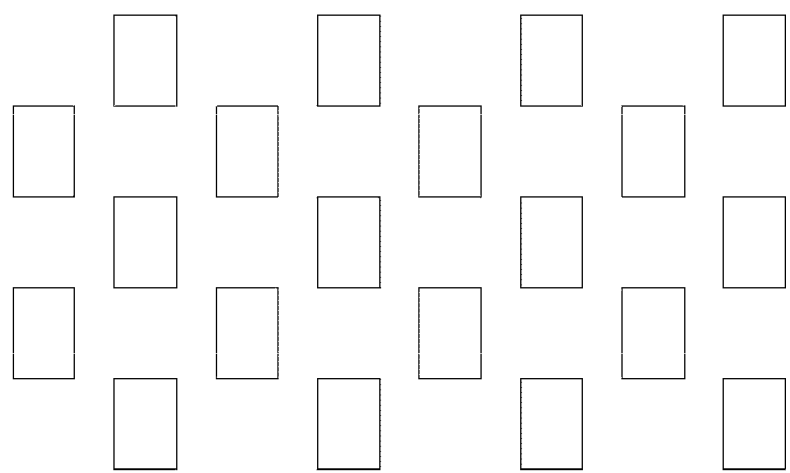
FIG. 7 is a schematic structural diagram of a mask corresponding to R sub-pixels in FIG. 6.
Figure 8:
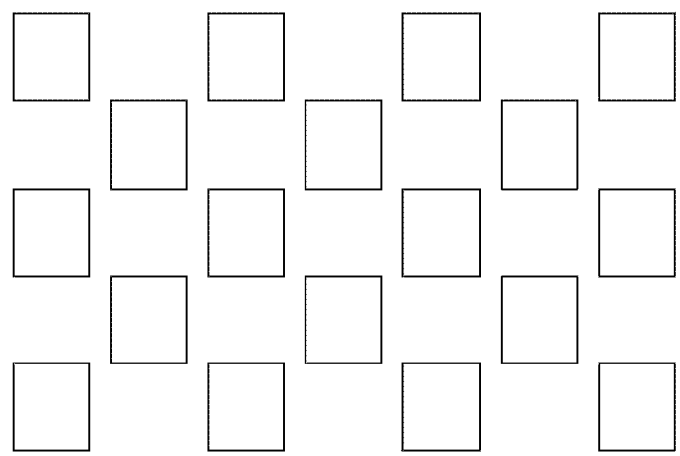
FIG. 8 is a schematic structural diagram of a mask corresponding to G sub-pixels in FIG. 6.
Figure 9:
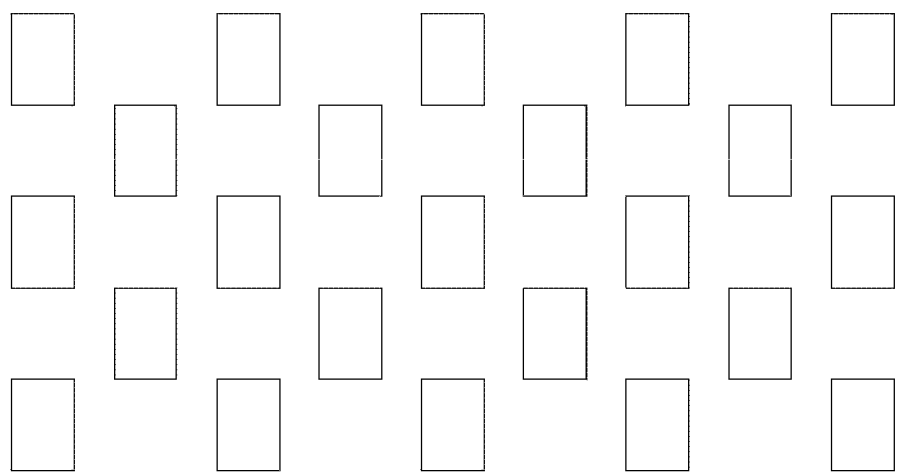
FIG. 9 is a schematic structural diagram of a mask corresponding to B sub-pixels in FIG. 6.

FIG. 7, FIG. 8, and FIG. 9 illustrate the metal mask openings corresponding to the R, and B sub-pixels in the pixel structure of FIG. 6 respectively, and as compared with the corresponding mask openings in FIG. 1, the sizes of the mask openings are increased, the difficulty of alignment is lowered, the sizes of mask ribs are increased, the strengths of masks are improved, and the thicknesses of the masks can be reduced in effect, so a shadow can be narrowed, a color crosstalk can be alleviated, and a good yield ratio can be improved.

In a third pattern, the sub-pixels in two pixel units in the row direction among the four pixel units in array are arranged in mirror symmetry, and the sub-pixels in two pixel units in the column direction among the four pixel units in a square are arranged in mirror symmetry.

Figure 10:
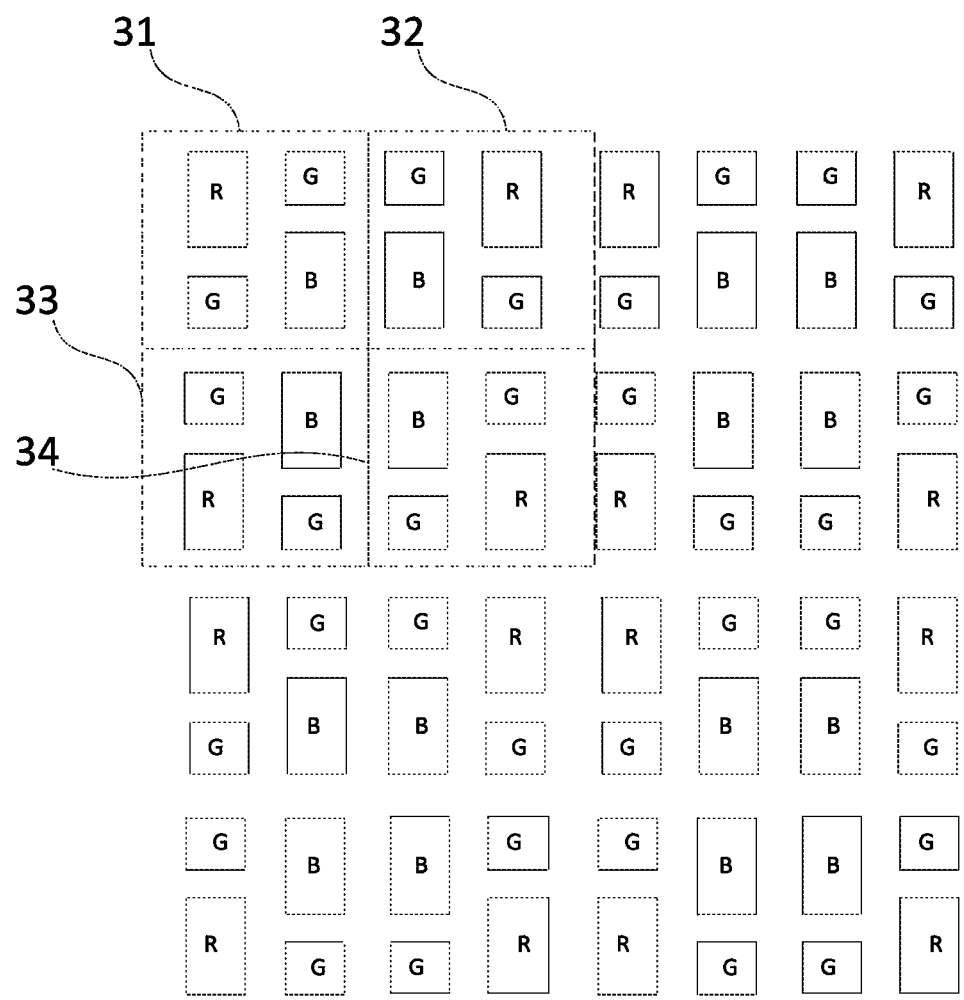
FIG. 10 is a third schematic structural diagram of the pixel structure according to the embodiment of the disclosure.

As illustrated in FIG. 10, a repeating element includes four pixel units in array, which are a first pixel unit 31, a second pixel unit 32, a third pixel unit 33, and a fourth pixel unit 34 including 16 sub-pixels in total. The first pixel unit 31 and the second pixel unit 32 are in a first row of the repeating element, the third pixel unit 33 and the fourth pixel unit 34 are in a second row of the repeating element, the first pixel unit 31 and the third pixel unit 33 are in a first column of the repeating element, the second pixel unit 32 and the fourth pixel unit 34 are in a second column of the repeating element.

Each pixel unit includes one R sub-pixel, one B sub-pixel, and two G sub-pixels, the first pixel unit 31 includes the R sub-pixel located at the top-left corner of the first pixel unit, the B sub-pixel located at the bottom-right corner of the first pixel unit, and the G sub-pixels located at the bottom-left corner and the top-right corner of the first pixel unit, the sub-pixels in the second pixel unit 32 are mirror symmetric to the sub-pixels in the first pixel unit 31, and the sub-pixels in the third pixel unit 33 and the sub-pixels in the fourth pixel unit 34 are mirror symmetric to the sub-pixels in the first pixel unit 31 and the sub-pixels in the second pixel unit 32 respectively.

Sub-pixels in the same color in every four adjacent pixels can share the same metal mask opening, that is, four R sub-pixels can share the same metal mask opening, four B sub-pixels can share the same metal mask opening, and four G sub-pixels can share the same metal mask opening.

Figure 11:
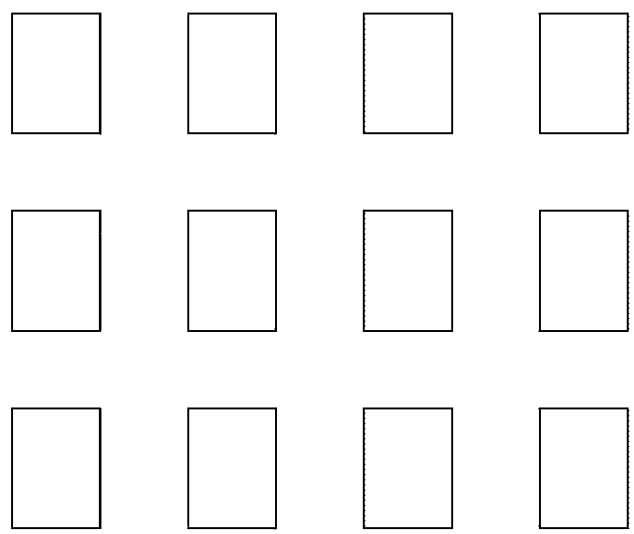
FIG. 11 is a schematic structural diagram of a mask corresponding to R sub-pixels in FIG. 10.
Figure 12:
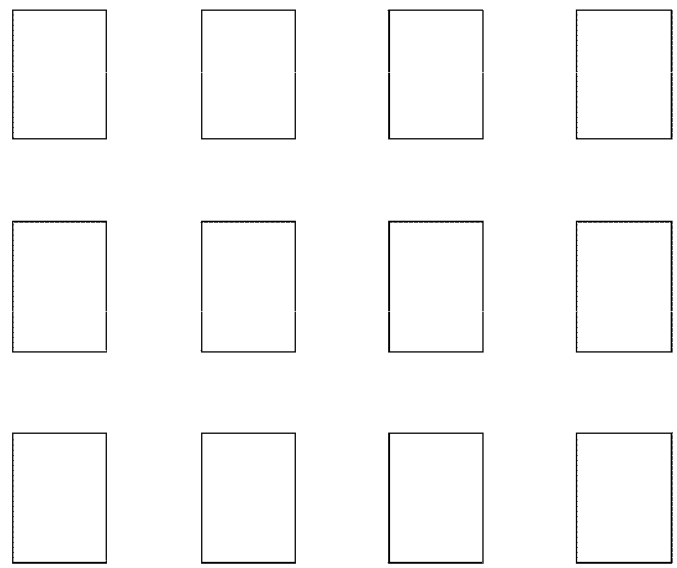
FIG. 12 is a schematic structural diagram of a mask corresponding to G sub-pixels in FIG. 10.
Figure 13:
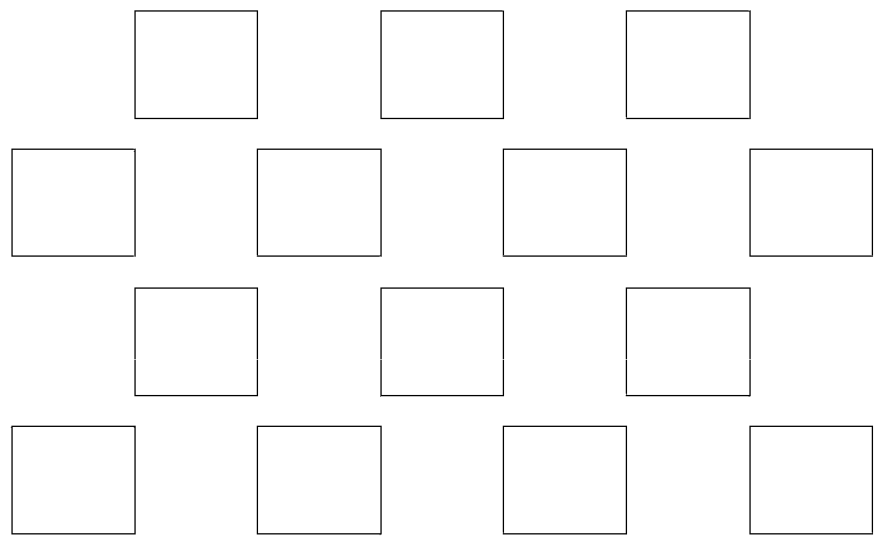
FIG. 13 is a schematic structural diagram of a mask corresponding to B sub-pixels in FIG. 10.

FIG. 11, FIG. 12, and FIG. 13 illustrate the metal mask openings corresponding to the R, G, and B sub-pixels in the pixel structure of FIG. 10 respectively, and as compared with the corresponding mask openings in FIG. 1, the sizes of the mask openings are increased, the difficulty of alignment is lowered, the sizes of mask ribs are increased, the strengths of masks are improved, and the thicknesses of the masks can be reduced in effect, so a shadow can be narrowed, a color crosstalk can be alleviated, and a good yield ratio can be improved.

In some embodiments, each repeating element includes two pixel units, the sub-pixels in the two pixel units are mirror symmetric in the row or column direction.

Figure 14:
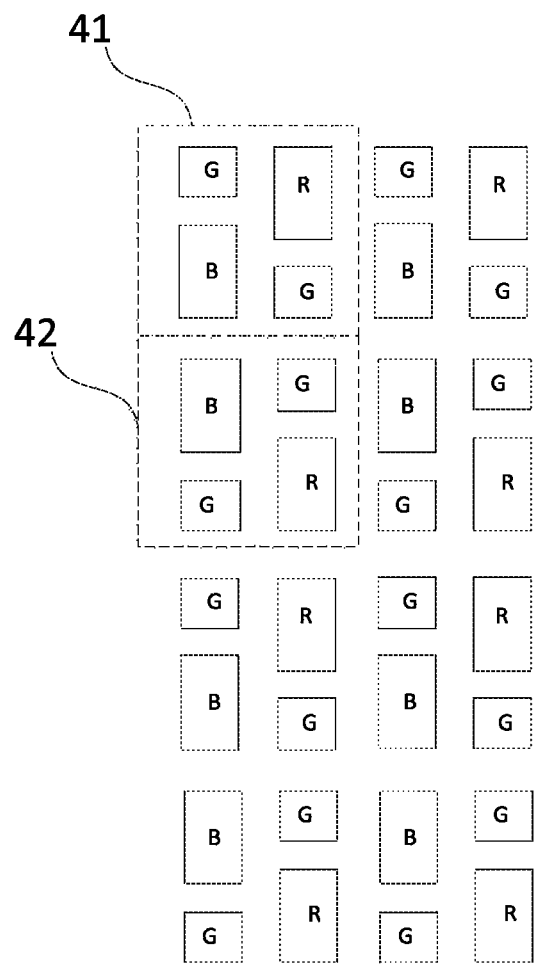
FIG. 14 is a fourth schematic structural diagram of the pixel structure according to the embodiment of the disclosure.

In the pixel structure above, as illustrated in FIG. 14, each repeating element includes a first pixel unit 41 and a second pixel unit 42 in a same column, including eight sub-pixels in total. The sub-pixels in the first pixel unit 41 are mirror symmetric to the sub-pixels in the second pixel unit 42 in the column direction.

Each pixel unit includes one R sub-pixel, one B sub-pixel, and two G sub-pixels, the first pixel unit 41 includes the R sub-pixel located at the top-right corner of the first pixel unit, the B sub-pixel located at the bottom-left corner of the first pixel unit, and the two G sub-pixels located respectively at the top-left and bottom-right corners of the first pixel unit, and the sub-pixels in the pixel unit 42 are mirror symmetric to the sub-pixels in the pixel unit 41.

Figure 15:
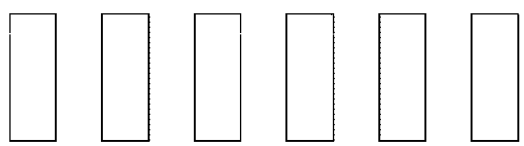
FIG. 15 is a schematic structural diagram of a mask corresponding to R sub-pixels in FIG. 14.
Figure 15:
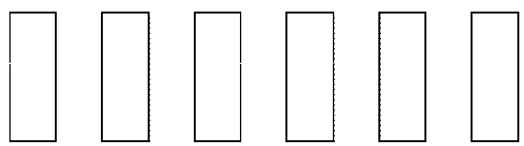
Figure 15:
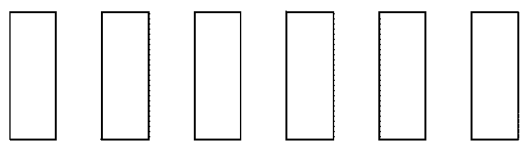
Figure 16:
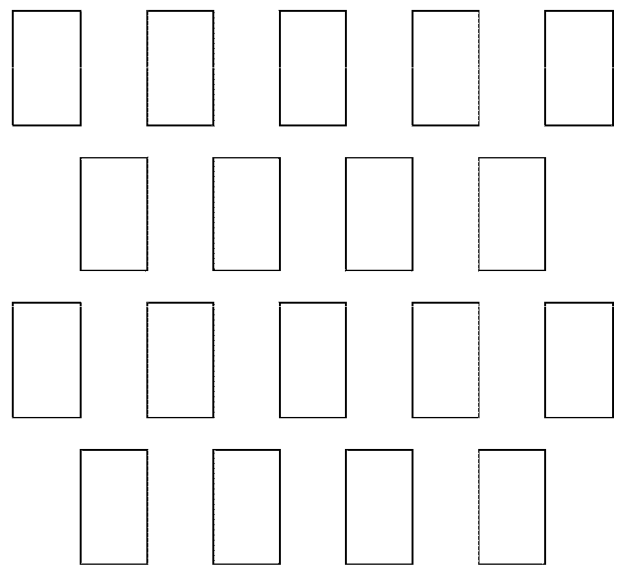
FIG. 16 is a schematic structural diagram of a mask corresponding to G sub-pixels in FIG. 14.
Figure 17:
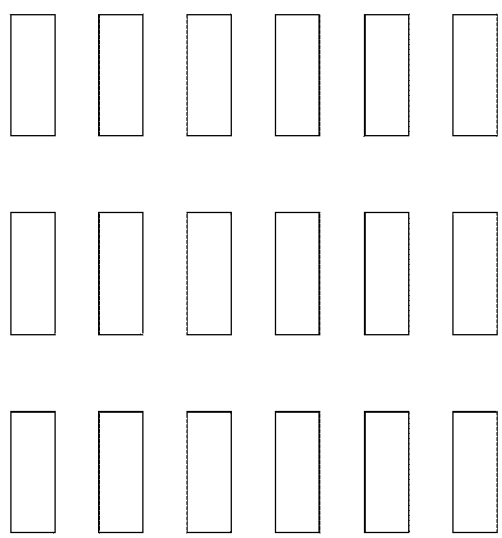
FIG. 17 is a schematic structural diagram of a mask corresponding to B sub-pixels in FIG. 14.

The sub-pixel in each pixel unit and the sub-pixel in a same color in another pixel unit above or below the pixel unit can share the same mask opening, so there are slit-shaped mask opening, and FIG. 15, FIG. 16, and FIG. 17 illustrate the metal mask openings corresponding to the R, G, and B sub-pixels in the pixel structure of FIG. 14 respectively; and as compared with the corresponding mask openings in FIG. 1, the sizes of the mask openings are increased, the difficulty of alignment is lowered, the sizes of mask ribs are increased, the strengths of masks are improved, and the thicknesses of the masks can be reduced in effect, so a shadow can be narrowed, a color crosstalk can be alleviated, and a good yield ratio can be improved.

In some embodiments, each repeating element includes one pixel unit, and two pixel units adjacent in the column direction are staggered.

Figure 18:
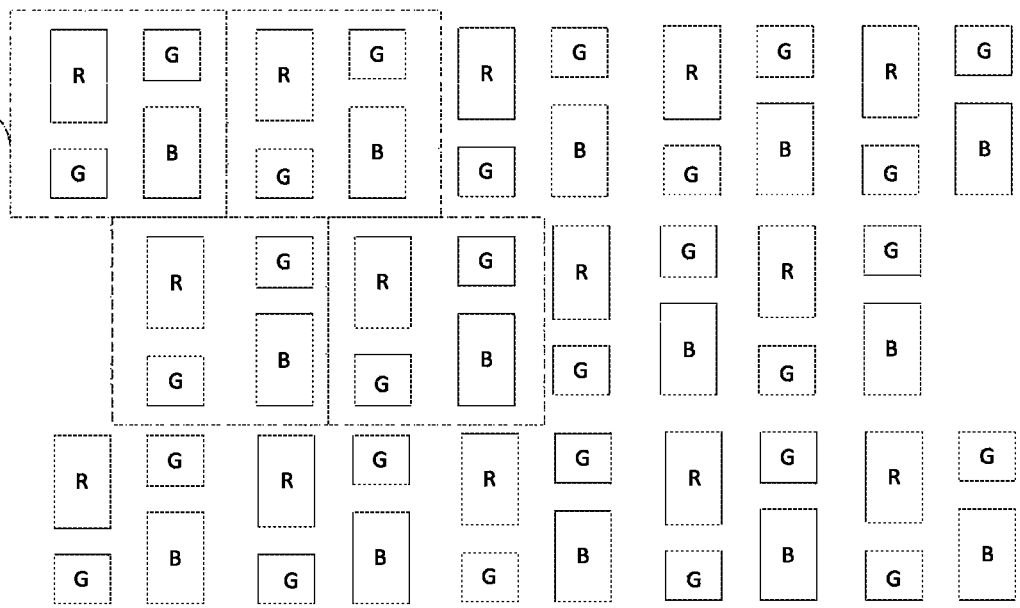
FIG. 18 is a fifth schematic structural diagram of the pixel structure according to the embodiment of the disclosure.
Figure 19:
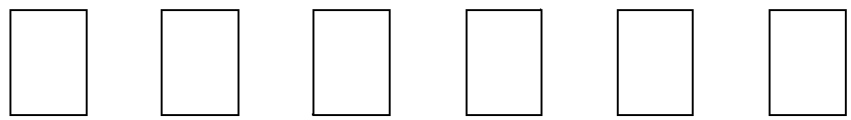
FIG. 19 is a schematic structural diagram of a mask corresponding to R sub-pixels in FIG. 18.
Figure 19:
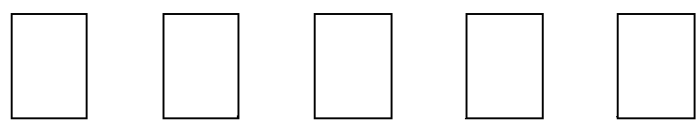
Figure 19:
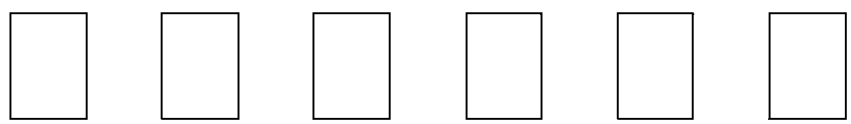
Figure 19:
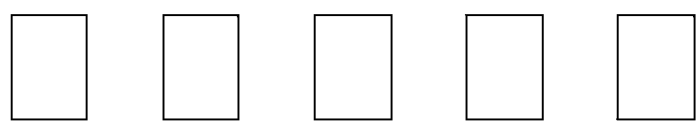
Figure 20:
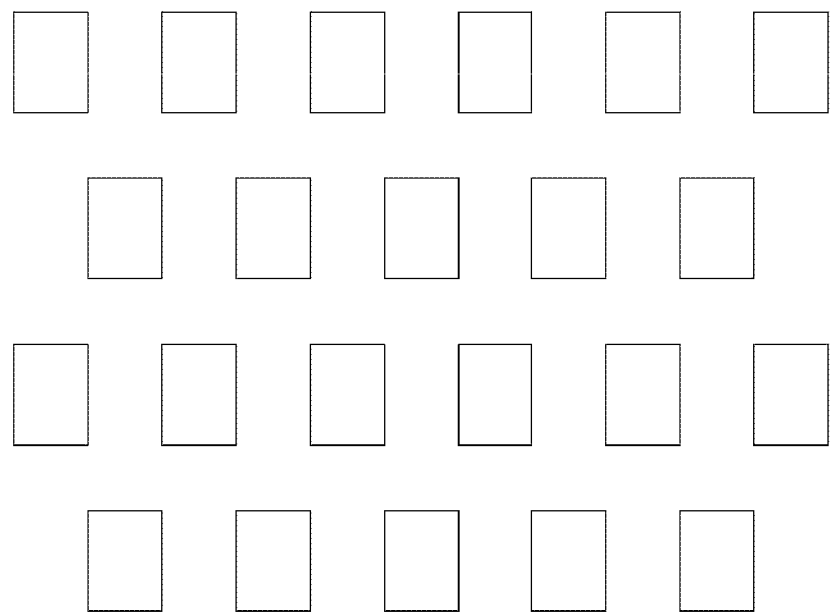
FIG. 20 is a schematic structural diagram of a mask corresponding to G sub-pixels in FIG. 18.
Figure 21:
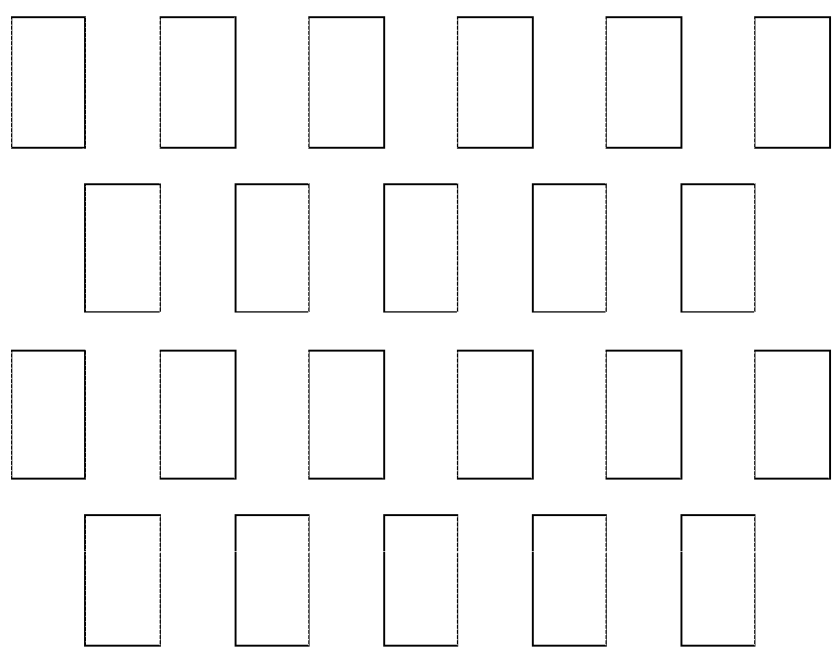
FIG. 21 is a schematic structural diagram of a mask corresponding to B sub-pixels in FIG. 18.

In the pixel structure above, as illustrated in FIG. 18, a repeating element includes one pixel unit 51 including four sub-pixels in total. The four sub-pixels include one R sub-pixel, one B sub-pixel, and two G sub-pixels, the pixel unit 51 includes the R sub-pixel located at the top-left corner of the pixel unit, the B sub-pixel located at the bottom-right corner of the pixel unit, and the two G sub-pixels located respectively at the bottom-left and top-right corners of the pixel unit, and the first row of sub-pixels and the second row of sub-pixels are staggered.

Where G sub-pixels in adjacent upper and lower pixel units are also adjacent to each other, and can share the same metal mask opening. FIG. 19, FIG. 20, and FIG. 21 illustrate the metal mask openings corresponding to the R, and B sub-pixels in the pixel structure of FIG. 18 respectively. As compared with the corresponding mask openings in FIG. 1, the sizes of the mask openings are increased, the difficulty of alignment is lowered, the sizes of mask ribs are increased, the strengths of masks are improved, and the thicknesses of the masks can be reduced in effect, so a shadow can be narrowed, a color crosstalk can be alleviated, and a good yield ratio can be improved.

In some embodiments, in order to further enable the sub-pixels to be arranged uniformly in the pixel structure, in each pixel unit, the pixel area of the first sub-pixel is the same as the pixel area of the second sub-pixel, and the pixel area of the first sub-pixel is twice the pixel area of the third sub-pixel.

In some embodiments, in the pixel structure above, as illustrated in FIG. 2, FIG. 6, FIG. 10, FIG. 14 and FIG. 18, in each pixel unit, the total pixel area of R sub-pixel, the total pixel area of B sub-pixel, and total pixel area of G sub-pixels are same, so the sub-pixels in each pixel unit can be arranged uniformly; and each repeating element includes at least one pixel unit, and the elements are arranged in an array, so that the pixel structure as a whole has a good light-emission effect, thus improving a good yield ratio.

In some embodiments, in the pixel structure above, as illustrated in FIG. 2, FIG. 6, FIG. 10, FIG. 14 and FIG. 18, in each of the pixels units, a shape of the third sub-pixel is a square, a shape of the first sub-pixel and a shape of the second sub-pixel both are rectangles formed by two third sub-pixels. In this way, the pixel area of R sub-pixel is twice the pixel area of G sub-pixel, so that the total pixel area of R sub-pixel, the total pixel area of B sub-pixel, and total pixel area of G sub-pixels are same in each pixel unit. The shape of G sub-pixel can alternatively be another shape, e.g., a rectangle, a hexagon, etc., although the embodiment of the disclosure will not be limited to any specific shape of the sub-pixel.

In order to further enable the sub-pixels to be arranged uniformly in the pixel structure, in some embodiments, as illustrated in FIG. 18, in each pixel unit, the pixel area of R sub-pixel is twice the pixel area of G sub-pixel, the pixel area of B sub-pixel is twice the pixel area of G sub-pixel, and the shape of R sub-pixel and the shape of B sub-pixel both are rectangles formed by two G sub-pixels, and in each pixel unit, the length direction of B sub-pixel and the length direction of R sub-pixel in each of the pixels units is a column direction of the pixel units. As illustrated in FIG. 18, the two pixel units adjacent in the column direction are staggered in the column direction by a half of a width of one of the pixel units, the width of the pixel unit is the width of the pixel unit in the row direction.

In the pixel structure above, as illustrated in FIG. 18, two pixel units adjacent in the column direction are staggered by a half of the width of one pixel unit in the column direction so that G sub-pixels adjacent in the column direction are aligned with each other to thereby still further enable the sub-pixels to be arranged uniformly in the pixel structure.

In some embodiments, as illustrated in FIG. 18, one G sub-pixel is located at the top-right corner of the pixel unit, and the other G sub-pixel is located at the bottom-left corner of the pixel unit; or as illustrated in FIG. 14, the pixel unit 41 includes the R sub-pixel located at the top-right corner of the pixel unit, the B sub-pixel located at the bottom-left corner of the pixel unit, and the two G sub-pixels located respectively at the top-left and bottom-right corners of the pixel units.

In the embodiments of the disclosure above, the four sub-pixels of each pixel unit are arranged in array, thus the sub-pixel being at top-left corner of the pixel unit refers to the sub-pixel being in a first row and a first column of the square array, the sub-pixel being at top-right corner of the pixel unit refers to the sub-pixel being in a first row and a second column of the square array, the sub-pixel being at bottom-left corner of the pixel unit refers to the sub-pixel being in a second row and a first column of the square array, the sub-pixel being at bottom-right corner of the pixel unit refers to the sub-pixel being in a second row and a second column of the square array.

In the embodiments of the disclosure above, the sub-pixels in two pixel units being mirror symmetry refers to that the sub-pixels in the two pixels units are axial symmetry along a center axis between the two adjacent pixel units. And the sub-pixels being mirror symmetry includes at least the colors of the sub-pixels, the pixel areas of the sub-pixels, and the shapes of the sub-pixels being mirror symmetry.

For the sake of convenient vapor-plating, in some embodiments, the sub-pixel group in the adjacent pixel units is formed using the same sub-pixel vapor-plating opening on a vapor-plating mask. A sub-pixel group can be formed using the same sub-pixel vapor-plating opening on a vapor-plating mask to thereby reduce the number of mask openings, save a material and time, and facilitate vapor-plating.

In another aspect, an embodiment of the disclosure further provides a display device. The display device includes an array substrate and the pixel structure above on the array substrate. The pixel structure in the display device can be reference to the embodiments of the pixel structure above, so a repeated description thereof will be omitted.

The display device can be a display panel or other complete product, such as a phone, a tablet computer, a TV set, a display, a notebook computer, a digital photo frame, a navigator, or any other product or component with a display function.

In the display device above, there is a good light-emission effect and an improved good yield ratio of the pixel structure, so there is a good light-emission effect and an improved good yield ratio of the display device.

The disclosure provides a pixel structure and a display device. In the pixel structure, each pixel unit includes four sub-pixels in array, the four sub-pixels including one first sub-pixel in a first color, one second sub-pixel in a second color, and two third sub-pixels in a third color, where the first sub-pixel and the second sub-pixel are located at diagonal positions in the pixel unit, and the two third sub-pixels are located on the other diagonal positions in the pixel unit, so that sub-pixels in each pixel unit are arranged uniformly. Each repeating unit includes at least one pixel unit, and the elements are arranged in an array, so that the pixel structure as a whole has a good light-emission effect, thus improving a good yield ratio. Since a plurality of sub-pixels in the two adjacent pixel units include at least one sub-pixel group, and the sub-pixel group includes two adjacent sub-pixels in the same color, so that two ones of the plurality of sub-pixels in the two adjacent sub-pixels share a larger metal mask opening, thus lowering the difficulty of alignment, increasing the size of a mask rib, improving the strength of a mask, and reducing the thickness of the mask, so a shadow can be narrowed, a color crosstalk can be alleviated, and a good yield ratio can be improved.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel structure, comprising: a plurality of elements in an array, wherein:
   each of the plurality of the elements comprises at least one pixel unit, and each of the at least one pixel unit comprises four sub-pixels in array, the four sub-pixels comprise: one first sub-pixel in a first color, one second sub-pixel in a second color, and two third sub-pixels in a third color, wherein the first sub-pixel and the second sub-pixel are at diagonal positions of the pixel unit, and the two third sub-pixels are at the other diagonal positions of the pixel unit; and
   a plurality of the sub-pixels in two adjacent pixel units comprise at least one sub-pixel group, the sub-pixel group comprising two adjacent sub-pixels in a same color;
   wherein each of the elements comprises four pixel units in array, the sub-pixels in two of the four pixel units in a column direction being mirror symmetry;
   wherein the four pixel units of each of the elements comprise a first pixel unit and a second pixel unit in one row, and a third pixel unit and a fourth pixel unit in another row, the first pixel unit and the third pixel unit being in one column, the second pixel unit and the fourth pixel unit being in another column, the sub-pixels in the first pixel unit being mirror symmetric to the sub-pixels in the third pixel unit, the sub-pixels in the second pixel unit being mirror symmetric to the sub-pixels in the fourth pixel unit;
   wherein in the first pixel unit, one third sub-pixel is at top-right corner of the first pixel unit, the other third sub-pixel is at bottom-left corner of the first pixel unit, the first sub-pixel is at top-left corner of the first pixel unit, and the second sub-pixel is at bottom-right corner of the first pixel unit;
   in the second pixel unit, one third sub-pixel is at top-left corner of the second pixel unit, the other third sub-pixel is at bottom-right corner of the second pixel unit, the second sub-pixel is at top-right corner of the second pixel unit, and the first sub-pixel is at bottom-left corner of the second pixel unit; and
   wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

2. A display device comprising: an array substrate and the pixel structure according to claim 1 on the array substrate.

3. The pixel structure according to claim 1, wherein in each of the pixels units, a shape of the third sub-pixel is a square, a shape of the first sub-pixel and a shape of the second sub-pixel both are rectangles formed by two third sub-pixels.

4. A pixel structure, comprising: a plurality of elements in an array, wherein:
   each of the plurality of the elements comprises at least one pixel unit, and each of the at least one pixel unit comprises four sub-pixels in array, the four sub-pixels comprise: one first sub-pixel in a first color, one second sub-pixel in a second color, and two third sub-pixels in a third color, wherein the first sub-pixel and the second sub-pixel are at diagonal positions of the pixel unit, and the two third sub-pixels are at the other diagonal positions of the pixel unit; and
   a plurality of the sub-pixels in two adjacent pixel units comprise at least one sub-pixel group, the sub-pixel group comprising two adjacent sub-pixels in a same color;
   wherein each of the elements comprises four pixel units in array, the sub-pixels in two of the four pixel units in a row direction being mirror symmetry, and the sub-pixels in two of the four pixel units in a column direction being mirror symmetry;
   wherein the four pixel units of each of the elements comprise a first pixel unit and a second pixel unit in one row, and a third pixel unit and a fourth pixel unit in another row, the first pixel unit and the third pixel unit being in one column, the second pixel unit and the fourth pixel unit being in another column, the sub-pixels in the first pixel unit being mirror symmetric to the sub-pixels in the second pixel unit, the sub-pixels in the first pixel unit being mirror symmetric to the sub-pixels in the third pixel unit, and the sub-pixels in the second pixel unit being mirror symmetric to the sub-pixels in the fourth pixel unit;
   wherein in the first pixel unit, one third sub-pixel is at top-right corner of the first pixel unit, the other third sub-pixel is at bottom-left corner of the first pixel unit, the first sub-pixel is at top-left corner of the first pixel unit, and the second sub-pixel is at bottom-right corner of the first pixel unit;
   wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

5. A display device comprising: an array substrate and the pixel structure according to claim 4 on the array substrate.

6. The pixel structure according to claim 4, wherein in each of the pixels units, a shape of the third sub-pixel is a square, a shape of the first sub-pixel and a shape of the second sub-pixel both are rectangles formed by two third sub-pixels.

7. A pixel structure, comprising: a plurality of elements in an array, wherein:
   each of the plurality of the elements comprises at least one pixel unit, and each of the at least one pixel unit comprises four sub-pixels in array, the four sub-pixels comprise: one first sub-pixel in a first color, one second sub-pixel in a second color, and two third sub-pixels in a third color, wherein the first sub-pixel and the second sub-pixel are at diagonal positions of the pixel unit, and the two third sub-pixels are at the other diagonal positions of the pixel unit; and
   a plurality of the sub-pixels in two adjacent pixel units comprise at least one sub-pixel group, the sub-pixel group comprising two adjacent sub-pixels in a same color;
   wherein each of the elements comprises two pixel units, the sub-pixels in the two pixels units in a column direction being mirror symmetry;
   wherein the two pixel units of each of the elements comprises a first pixel unit and a second pixel unit in a same column, the sub-pixels in the first pixel unit being mirror symmetric to the sub-pixels in the second pixel unit in a column direction;
   wherein in the first pixel unit, one third sub-pixel is at top-left corner of the first pixel unit, the other third sub-pixel is at bottom-right corner of the first pixel unit, the first sub-pixel is at top-right corner of the first pixel unit, and the second sub-pixel is at bottom-left corner of the first pixel unit;
   wherein in each of the pixel units, a pixel area of the first sub-pixel is same as a pixel area of the second sub-pixel, the pixel area of the first sub-pixel is twice a pixel area of the third sub-pixel, and the first sub-pixel is a red sub-pixel configured to emit red light, the second sub-pixel is a blue sub-pixel configured to emit blue light, and the third is a green sub-pixel configured to emit green light.

8. The pixel structure according to claim 7, wherein in each of the pixels units, a shape of the third sub-pixel is a square, a shape of the first sub-pixel and a shape of the second sub-pixel both are rectangles formed by two third sub-pixels.

9. A display device comprising: an array substrate and the pixel structure according to claim 7 on the array substrate.

* * * * *